(12) United States Patent
Perego

(10) Patent No.: US 9,337,872 B2
(45) Date of Patent: May 10, 2016

(54) CONFIGURABLE, ERROR-TOLERANT MEMORY CONTROL

(75) Inventor: Richard E. Perego, Thornton, CO (US)

(73) Assignee: Rambus Inc., Sunnyvale, CA (US)

(*) Notice: Subject to any disclaimer, the term of this patent is extended or adjusted under 35 U.S.C. 154(b) by 151 days.

(21) Appl. No.: 14/112,935

(22) PCT Filed: Mar. 10, 2012

(86) PCT No.: PCT/US2012/028658
§ 371 (c)(1),
(2), (4) Date: Oct. 20, 2013

(87) PCT Pub. No.: WO2012/151001
PCT Pub. Date: Nov. 8, 2012

(65) Prior Publication Data
US 2014/0047306 A1 Feb. 13, 2014

Related U.S. Application Data

(60) Provisional application No. 61/481,151, filed on Apr. 30, 2011.

(51) Int. Cl.
*H03M 13/35* (2006.01)
*G06F 11/10* (2006.01)
*G06F 11/16* (2006.01)

(52) U.S. Cl.
CPC ............ *H03M 13/356* (2013.01); *G06F 11/10* (2013.01); *G06F 11/1666* (2013.01)

(58) Field of Classification Search
CPC .............. H04L 1/0088; H04L 1/007; H04L 2001/0098; H03M 13/35; H03M 13/353; H03M 13/356

USPC .......................................................... 714/774
See application file for complete search history.

(56) References Cited

U.S. PATENT DOCUMENTS

| | | | | |
|---|---|---|---|---|
| 4,825,438 A * | 4/1989 | Bennett et al. | ................... | 714/56 |
| 6,862,688 B2 * | 3/2005 | Ochiai | .............................. | 714/2 |
| 6,965,636 B1 * | 11/2005 | DesJardins et al. | ............ | 375/219 |
| 7,836,378 B2 | 11/2010 | Shaeffer et al. | | |
| 8,122,323 B2 * | 2/2012 | Leung et al. | ................... | 714/774 |
| 8,200,879 B1 * | 6/2012 | Falik | ......................... | G11C 5/02 |
| | | | | 710/307 |
| 8,429,492 B2 * | 4/2013 | Yoon et al. | ..................... | 714/763 |
| 8,862,973 B2 * | 10/2014 | Bains | .................. | G06F 11/1016 |
| | | | | 714/800 |
| 2003/0023921 A1 * | 1/2003 | Collier | .............. | H03M 13/6516 |
| | | | | 714/758 |
| 2003/0163769 A1 * | 8/2003 | Phelps | ................ | G06F 13/4234 |
| | | | | 714/43 |

(Continued)

OTHER PUBLICATIONS

Ching-Yi Chen; Cheng-Wen Wu, "An adaptive code rate EDAC scheme for random access memory," Design, Automation & Test in Europe Conference & Exhibition (DATE), 2010 , vol., No., pp. 735,740, Mar. 8-12, 2010.*

(Continued)

*Primary Examiner* — Steve Nguyen
(74) *Attorney, Agent, or Firm* — Charles Shemwell

(57) ABSTRACT

Configurable, error-tolerant communication of memory control information between components of a memory system. A controller component and memory component each have a variable-width command/address (CA) interface that operates in conjunction with an error detection/correction (EDC) channel to enable a variable level of error detection and correction with respect to command/address information conveyed between the two components as the widths of the CA interfaces are adjusted.

19 Claims, 7 Drawing Sheets

(56) References Cited

U.S. PATENT DOCUMENTS

| | | |
|---|---|---|
| 2004/0049629 A1 | 3/2004 | Miura et al. |
| 2005/0022074 A1* | 1/2005 | Kuzmenka ............ G06F 11/073 714/57 |
| 2006/0069948 A1* | 3/2006 | Seo ..................... G06F 11/1016 714/6.12 |
| 2006/0190780 A1* | 8/2006 | Gower et al. ................. 714/718 |
| 2007/0038907 A1* | 2/2007 | Jeddeloh et al. ............. 714/718 |
| 2007/0109858 A1 | 5/2007 | Conley et al. |
| 2008/0022193 A1* | 1/2008 | Maciver et al. .............. 714/800 |
| 2008/0094811 A1* | 4/2008 | Hazelzet ................. G11C 5/04 361/760 |
| 2008/0201626 A1 | 8/2008 | Sturm et al. |
| 2009/0063729 A1* | 3/2009 | Gower ................ G06F 11/1048 710/35 |
| 2009/0172480 A1* | 7/2009 | Jeddeloh ....................... 714/720 |
| 2009/0187785 A1 | 7/2009 | Gonzalez et al. |
| 2010/0077267 A1* | 3/2010 | Perego ................. G11C 7/1075 714/716 |
| 2010/0162053 A1 | 6/2010 | Gillingham |
| 2014/0372816 A1* | 12/2014 | Bains et al. ................... 714/723 |

OTHER PUBLICATIONS

PCT International Preliminary Report dated Nov. 14, 2013 (Chapter I) in International Application No. PCT/US2012/028658. 6 pages.

* cited by examiner

Controller Component

FIG. 4B

Control Port Selection

| CP Count | CP Width (P3\|P2\|P1\|P0) | Control Port Selection for RQ1 (Psel[0]) | Control Port Selection for RQ2 (Psel[1]) | Control Port Selection for RQ3 (Psel[1]) |
|---|---|---|---|---|
|  | 0\|0\|0\|1 | xx | xx | xx |
| 1 | 0\|0\|0\|2 | P0 | xx | xx |
|  | 0\|0\|0\|4 | P0 | P0 | P0 |
|  | 0\|0\|1\|1 | P1 | xx | xx |
| 2 | 0\|0\|1\|2 | P0 | P1 | P1 |
|  | 0\|0\|2\|2 | P1 | P1 | P1 |
| 3 | 0\|1\|1\|1 | P1 | P2 | xx |
|  | 0\|1\|1\|2 | P0 | P1 | P2 |
| 4 | 1\|1\|1\|1 | P1 | P2 | P3 |

FIG. 4C

Unbypassed, Control Port and CA Interface Configuration

| CP Count | CP Width | Control Port 0 Mode_Sel[0][1:0] | Control Port 1 Mode_Sel[1][1:0] | Control Port 2 Mode_Sel[2][1:0] | Control Port 3 Mode_Sel[3][1:0] | RQ0 | RQ1 | RQ2 | RQ3 |
|---|---|---|---|---|---|---|---|---|---|
|  | 0\|0\|0\|1 | 00: CAx1 with TEC | xx: (unused) | xx: (unused) | xx: (unused) | P0:ENCAx1[31:0] | disabled | disabled | disabled |
| 1 | 0\|0\|0\|2 | 01: CAx2 with DEC-TED | xx: (unused) | xx: (unused) | xx: (unused) | P0:ENCAx2[31:0] | P0:ENCAx2[63:32] | disabled | disabled |
|  | 0\|0\|0\|4 | 10: CAx4 with DEC-TED | xx: (unused) | xx: (unused) | xx: (unused) | P0:ENCAx4[31:0] | P0:ENCAx4[63:32] | P0:ENCAx4[96:64] | P0:ENCAx4[127:96] |
|  | 0\|0\|1\|1 | 00: CAx1 with TEC | 00: CAx1 with TEC | xx: (unused) | xx: (unused) | P0:ENCAx1[31:0] | P1:ENCAx1[31:0] | disabled | disabled |
| 2 | 0\|0\|1\|2 | 01: CAx2 with DEC-TED | 00: CAx1 with TEC | xx: (unused) | xx: (unused) | P0:ENCAx2[31:0] | P0:ENCAx2[63:32] | P1:ENCAx1[31:0] | disabled |
|  | 0\|0\|2\|2 | 01: CAx2 with DEC-TED | 01: CAx2 with DEC-TED | xx: (unused) | xx: (unused) | P0:ENCAx2[31:0] | P0:ENCAx2[63:32] | P1:ENCAx2[31:0] | P1:ENCAx2[63:32] |
| 3 | 0\|1\|1\|1 | 00: CAx1 with TEC | 00: CAx1 with TEC | 00: CAx1 with TEC | xx: (unused) | P0:ENCAx1[31:0] | P1:ENCAx1[31:0] | P2:ENCAx1[31:0] | disabled |
|  | 0\|1\|1\|2 | 01: CAx2 with DEC-TED | 00: CAx1 with TEC | 00: CAx1 with TEC | xx: (unused) | P0:ENCAx1[31:0] | P0:ENCAx2[63:32] | P1:ENCAx1[31:0] | P2:ENCAx1[31:0] |
| 4 | 1\|1\|1\|1 | 00: CAx1 with TEC | 00: CAx1 with TEC | 00: CAx1 with TEC | 00: CAx1 with TEC | P0:ENCAx1[31:0] | P1:ENCAx1[31:0] | P2:ENCAx1[31:0] | P3:ENCAx1[31:0] |

FIG. 5A
FIG. 5B
FIG. 5C

CONFIGURABLE, ERROR-TOLERANT MEMORY CONTROL

CROSS REFERENCE TO RELATED APPLICATIONS

Pursuant to 35 U.S.C. §§365 and 371, this application is a United States National Stage Application that claims priority to International Application No. PCT/US2012/028658 filed Mar. 10, 2012, which claims priority to U.S. Provisional Patent Application No. 61/481,151 filed Apr. 30, 2011. Each of the above-identified patent applications is hereby incorporated by reference in its entirety.

TECHNICAL FIELD

The present invention relates generally to the field of integrated circuits, and more particularly to error-tolerant communication of operational information between components of a memory system.

BRIEF DESCRIPTION OF THE DRAWINGS

The present invention is illustrated by way of example, and not by way of limitation, in the figures of the accompanying drawings and in which like reference numerals refer to similar elements and in which:

FIG. 4B illustrates exemplary control port assignments within the controller component logic of FIG. 4A;

FIG. 4C illustrates a table of operating modes that may be selected within the controller component logic of FIG. 4A;

FIGS. 5A-5C illustrate exemplary arrangements of command/address bits and error-checking bits within incoming bit streams for respective modes of operation within the memory component and controller component of FIG. 1.

DETAILED DESCRIPTION

Configurable, error-tolerant communication of memory control information between components of a memory system is disclosed in various embodiments. In a number of embodiments, for example, a controller component and memory component each have a variable-width command/address (CA) interface that operates in conjunction with an error information (EI) channel to enable a variable level of error detection and/or correction ("EDC") with respect to command/address information (i.e., information bearing command and/or address values, also referred to herein as "request information") conveyed between the two components as the widths of the CA interfaces are adjusted. In one implementation (or configuration), the error information channel is implemented by respective dedicated signaling interfaces within the controller component and memory component(s), and one or more chip-to-chip signaling links coupled between those interfaces. In another implementation, the error information channel is implemented by time multiplexed transmission of error information over one or more CA links, with error information being, for example, appended to (or pre-pended to or embedded within) a corresponding command/address transmission. In a number of embodiments described below, the error information includes error-check bits that may be used to detect and in some instances correct one or more bit errors within corresponding information transmitted over the CA links. Accordingly, the error information is occasionally referred to herein as error detect/correct information and the error-related operations as error detection/correction (EDC) operations. More generally, the error information includes any information that can be used or associated with detecting occurrence of an error. The corrective action, if any, may be independent of the error detection operation. Accordingly, all references to "error detection/correction" information or operations refer to error detection information or error detection operations that may facilitate but do not require error correction.

Figure 1:
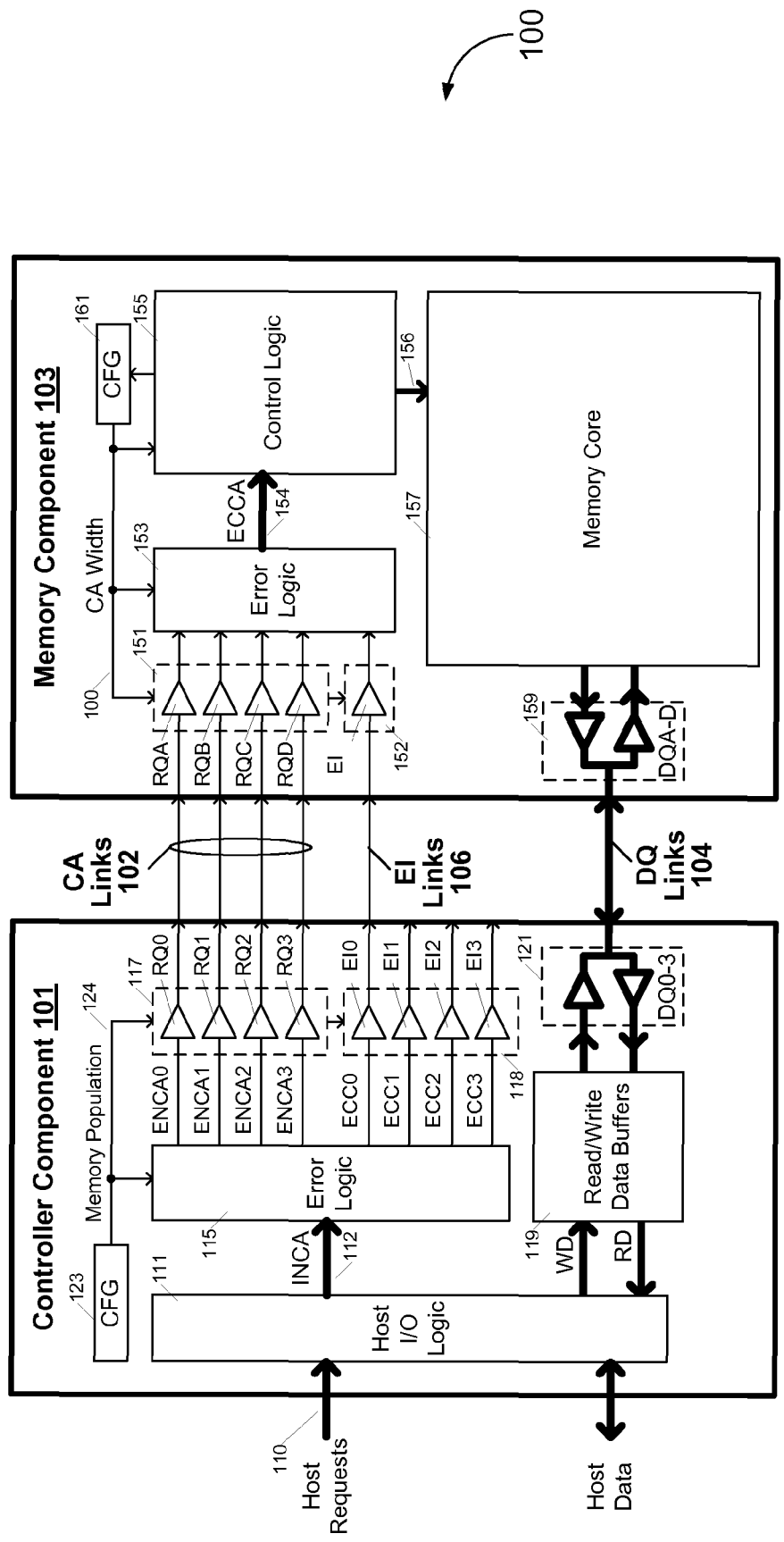
FIG. 1 illustrates an embodiment of a memory system that enables configurable, error-tolerant communication of memory access commands and addresses.

FIG. 1 illustrates an embodiment of a memory system 100 that enables configurable, error-tolerant communication of memory access commands and addresses. The memory system includes a controller component 101 and memory component 103 coupled to one another via command/address (CA) signaling links 102 and write/read data (DQ) signaling links 104. In the particular embodiment shown, and other embodiments described below, the control and memory components are also coupled to one another via an error information (EI) signaling link 106, though in all such cases the information communicated over the error information signaling link may be partially or entirely time-multiplexed onto the CA signaling links and/or DQ signaling links.

In general, the controller component 101 and memory component 103 operate as master and slave, with the controller component issuing memory access commands (e.g., row and column access commands, program/erase commands, etc.), maintenance commands (e.g., memory core refresh, timing calibration, signal driver/receiver calibration, equalization control, etc.) and configuration commands (e.g., register programming commands) to the memory component via CA signaling links 102, and the memory component responding by carrying out the commanded operation, such as storing write data received from the controller component or returning read data to the controller component via DQ signaling links 104.

Memory access commands may vary according to the core technology (e.g., row activation commands and column read/column write commands within a DRAM (dynamic random access memory) device; program and erase commands within a flash memory device, etc.), but are generally accompanied by address values that specify memory core locations to be accessed in various memory core operations. In the embodiment of FIG. 1 and those below, a DRAM memory core is assumed within memory component 103 (and thus memory access commands that specify row activation operations, column read operations and column write operations), though in all cases a different type of memory core may be present and a different set of memory access commands may apply.

In the embodiment of FIG. 1, the control and memory components (101, 103) are implemented by distinct (separate) IC dies with the interconnecting CA, DQ and EI signaling links formed by printed circuit board traces, cables (e.g., flex-tape cables or the like), bond wires, through-silicon vias, or any other structures for conveying signals between the two dies. In other embodiments, the control and memory components may be implemented by separate functional circuit blocks within the same IC die and the interconnecting signaling links formed within one or more metal layers or other on-die conductive structures. Conversely, the individual components shown in FIG. 1 and other embodiments below may each be representative of multiple integrated circuit dies. For example, memory component 103 may be representative of multiple memory components disposed on a socketed (i.e., removably inserted into a connector socket) memory module, coupled in common to CA signaling links 102 and coupled to respective, mutually exclusive subsets of DQ links 104, thereby forming a "rank" of memory components that may be read from and written to in parallel, as a unit.

While shown in isolation, memory system 100 generally forms part of a subsystem within a larger host system (e.g., mobile phone, notebook computer, tablet computer, desktop computer, video/audio playback/recording device, gaming device, global positioning system or any other device requiring data storage) having one or more memory access requestors, such as a processor or application-specific IC (ASIC). Though generally described herein as being separate from controller component 101, any or all of the memory access requestors or "host requestors" may be implemented on the same or different die as the controller component 101, as in the case of a processor core (or multiple processor cores) implemented on a die also having a memory controller function. In all cases, each host requestor may issue memory access requests to (or within) controller component 101, requesting retrieval or storage of data at specified logical or physical addresses within memory component 101. As discussed below, controller component 101 includes circuitry to organize such memory access requests, referred to herein (and shown in FIG. 1) as "host requests," 110 for eventual execution, for example by converting each host request into one or more command/address values and queuing the command/address values for execution.

Internally, controller component 101 includes host input/output (I/O) logic 111, error logic 115, CA output interface 117, error information (EI) output interface 118, read/write data buffers 119, data I/O interface 121, and configuration circuit 123, all of which cooperate to service host requests 110. More specifically, host I/O logic 111 converts/organizes host memory access requests ("host requests") into a stream of incoming command/address values (INCA) 112 and transfers read and write data corresponding to the command/address values between read/write data buffers 119 and a host data interface ("Host Data"). The incoming command/address values 112 are supplied in sequence to error logic 115 which outputs, in turn, a configurable number of encoded command/address values (ENCA0-ENCA3) and corresponding error correction code (ECC) values (ECC0-ECC3) to respective serializing output drivers within CA interface 117 and EI output interface 118. More specifically, CA output drivers RQ0-RQ3 constitute CA output interface 117 (or request port) and are selectively enabled to transmit the configurable number of command/address values as serial bit streams over respective CA links 102. Similarly, error information output drivers, EI0-EI3, constitute EI output interface 118 and are selectively enabled to transmit the error correction code values to respective memory components 103. In the particular example shown, only one memory component 103 is coupled to controller component 101, so only a single error information output driver (EIO) is enabled to transmit the serialized ECC value over EI signaling link 106.

As discussed in greater detail below, configuration circuit 123 is programmed (e.g., by a host component or by operation of the controller component itself) with one or more values that indicate the ratio of active (i.e., enabled) CA output drivers for each active EI output driver and thus, in effect, the population size (or number) of independently controlled memory components 103 attached to controller component 101. This "memory population" information 124 is provided to error logic 115 which responsively encodes the incoming CA values into the outgoing encoded CA values (i.e., in accordance with the number of independently controlled memory components 103), and also to the CA and EI output driver banks 117 and 118, thereby selectively enabling the error information output drivers EI0-EI3 according to the number of independently controlled memory components present in memory system 100.

Turning to memory component 103, a bank of input receivers, RQA-RQD, forms a variable-width CA interface 151 that receives and deserializes the incoming serialized, encoded command/address values transmitted by controller component 101. The deserialized command/address values are supplied, together with error information received and deserialized within error information interface 152 (populated by a solitary deserializing receiver, "EI"), to an error logic circuit 153 which performs error detection and correction functions to yield a sequence of error-corrected command/address values 154 (ECCA). The error-corrected command/address values 154 are supplied to control logic 155 which, in turn, issues addresses and control signals 156 to memory core ("core array and access control logic") 157 to carry out the commanded memory operations. In the case of a row activation (or sense) operation, for example, control logic 155 outputs bank and row addresses (conveyed in an error-corrected CA value) and row-sense control signals to memory core 157 to open a selected page of memory within the core array (i.e., loading an address-specified row of data within address-specified storage bank into a sense amplifier array for subsequent column read/column write access). In the case of column read or write operations, control logic 155 outputs bank and column addresses and column control signals to memory core 157 to enable incoming write data (received via DQ signaling links 104 deserializing data receivers within data I/O transceiver 159) to be loaded into the address-specified column of an open memory page, or to enable the address-specified column of read data to be output to the controller component 101 via serializing output drivers within data I/O transceiver 159 and DQ signaling links 104.

The memory component also includes a configuration circuit 161 that configures the logical width of CA interface 151. In the embodiment shown, for example, configuration circuit 161 provides a CA width value 100 (or signals derived in response thereto) to enable only those serializing receivers (RQA-RQD) within CA interface 151 employed for CA signal reception in a given memory system configuration, and also provides the CA width value (or derived signals) to error logic 153 and control logic 155. As explained below, error logic 153 may perform one of a number of different error information decoding operations based on the width of the CA interface (and thus the ratio of error information to CA information received over a given interval). Control logic 155 may also respond to incoming error-corrected command/address values in accordance with the width configuration of the CA interface. For example, in an embodiment in which each enabled CA receiver (RQA-RQD) receives a respective stream of memory access commands, the control logic may apply the different streams of memory access commands to respective regions of memory core 157 in parallel, in effect dividing the memory core into a number of separately accessed logical memories according to the interface width configuration. Also, while embodiments herein are generally described in terms of error detection and error correction functions, in all cases, the error correction function may be performed by other logic circuits within a given integrated circuit die, by another integrated circuit die (e.g., an error-detecting memory component may communicate an error detection to a controller component, inviting a re-transmission of the memory command), or even dispensed with altogether.

Still referring to FIG. 1, configuration circuit 161 may be programmed in response to one or more register-write commands delivered via all or a subset of CA signaling links 102 (e.g., delivered over the CA signaling link coupled to CA receiver RQA, which is enabled even in the minimum CA interface width configuration) together with configuration information (i.e., interface width information and optionally other information to be stored within configuration circuit 161) transmitted, for example, in bit-fields otherwise used to convey address information. The register-write commands and/or configuration information may additionally or alternatively be delivered to one or more attached memory components via a sideband control interface or serial interface (not shown). However communicated, control logic 155 responds to the register-write command(s) by storing the configuration information within configuration circuit 161, thus establishing the width of the CA interface for subsequent transfers via CA signaling links 102. As explained below, a similar programming operation may be carried out within the controller component, but in response to host commands or by operation of the controller component itself upon determining the nature and quantity of attached memory components.

Figure 2:
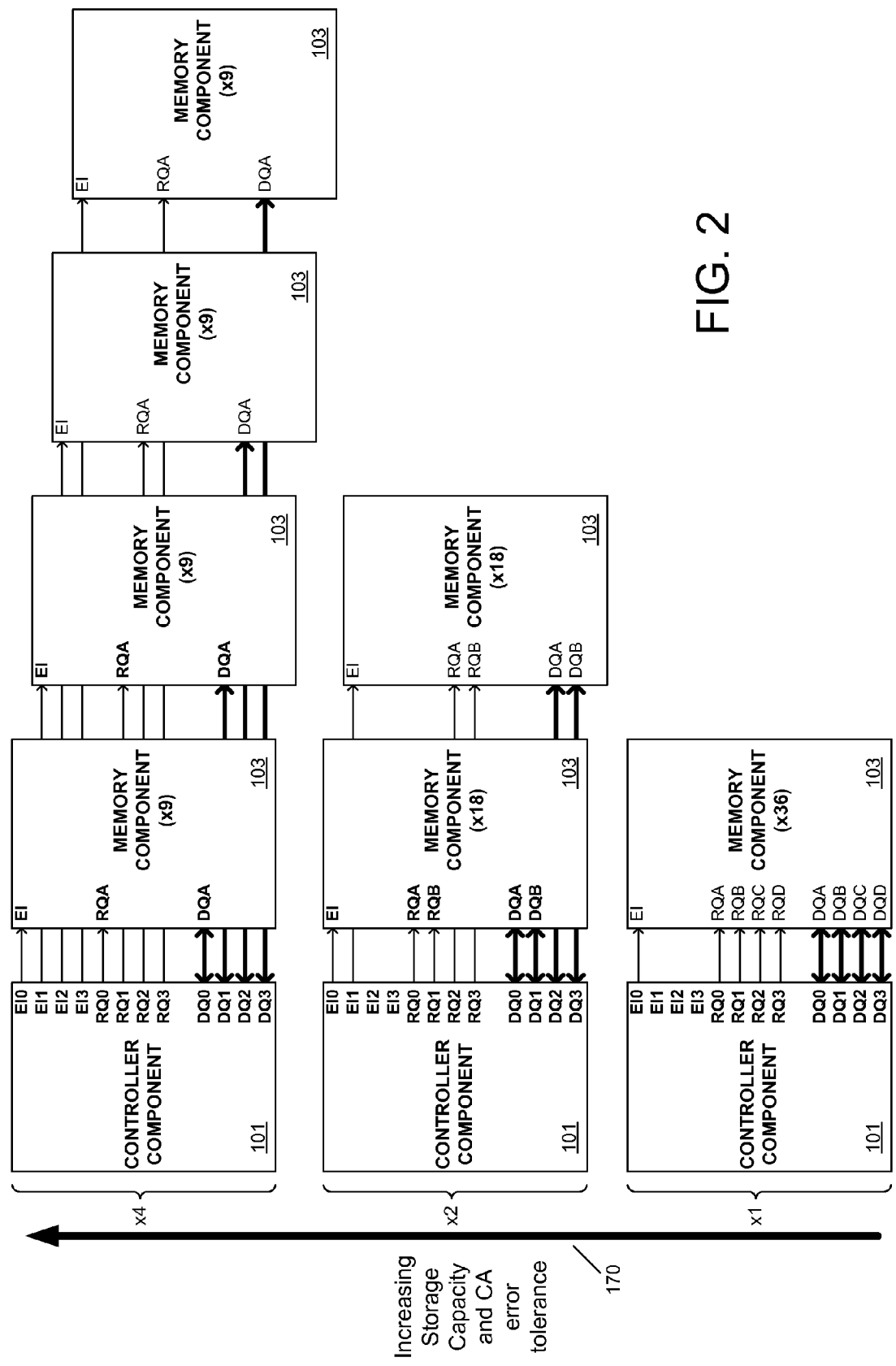
FIG. 2 presents an exemplary high-level view of the memory system of FIG. 1, illustrating the increasing storage capacity and command/address communication error-tolerance as additional memory components are added.

FIG. 2 presents a high-level view of memory system 100, illustrating the increasing storage capacity and command/address communication error-tolerance as additional memory components 103 are added. That is, in the dual-memory arrangement ("x2"), a second memory component 103 is added (relative to the single-memory arrangement, "x1") to double the storage capacity of the memory system, and in the quad arrangement ("x4"), third and fourth memory components are further added to double the storage capacity again (i.e., yielding four times the capacity of the system with a single memory component 103). The width of the data interface of memory component 103 (i.e., interface 159 in FIG. 1) is configurable to accommodate the full data bandwidth of controller component 101 in the single memory arrangement, half the data bandwidth of the controller component in the dual memory arrangement, and one quarter of the data bandwidth in the quad memory arrangement. That is, in the single-memory arrangement, controller-component data I/O circuits DQ0-DQ3, each assumed to be 9-bits wide for purposes of example (other widths may be supported in alternative embodiments), are coupled to counterpart memory-component data I/O circuits DQA-DQD, respectively, to establish a 36-bit wide data interface within memory component 103. In the dual-memory arrangement, each memory component 103 is operated with an 18-bit wide data interface with controller-component I/O circuits DQ0 and DQ1 coupled to I/O circuits DQA and DQB of a first memory component 103, and controller-component I/O circuits DQ2 and DQ3 coupled to I/O circuits DQA and DQB of another memory component 103. Subdividing further, in the quad-memory arrangement each memory component 103 operates with a 9-bit wide data interface, with controller-component I/O circuits DQ0-DQ3 coupled to respective I/O circuits DQA within four memory components 103.

Still referring to FIG. 2, the configurable width of the CA interface of memory component 103 enables the CA bandwidth of controller component 101 to be divisibly allocated, providing further flexibility within the memory system. That is, a given memory component 103 may receive command/address information from all, half or one quarter of the CA output drivers within the CA interface of controller component 101 in the single, dual and quad memory arrangements, respectively, and thus receive command/address information at the full, half or quarter command/address signaling bandwidth of controller component 101.

As FIG. 2 illustrates, each memory component 103 is coupled to receive error information via a respective error information link (which may be more than one link in alternative embodiments) so that the error information signaling bandwidth allocated to a given memory component remains constant even as the number of memory components rises and the CA bandwidth per component falls. Said another way, the ratio of error information to CA information provided in conjunction with a block of command/address information rises as the CA interface of the memory component narrows. Accordingly, as shown by the graphic at 170, the error correction capability within a given memory component and thus the error tolerance of the memory system as a whole rises as the memory component population (and storage capacity of the memory system) increases.

Figure 3:
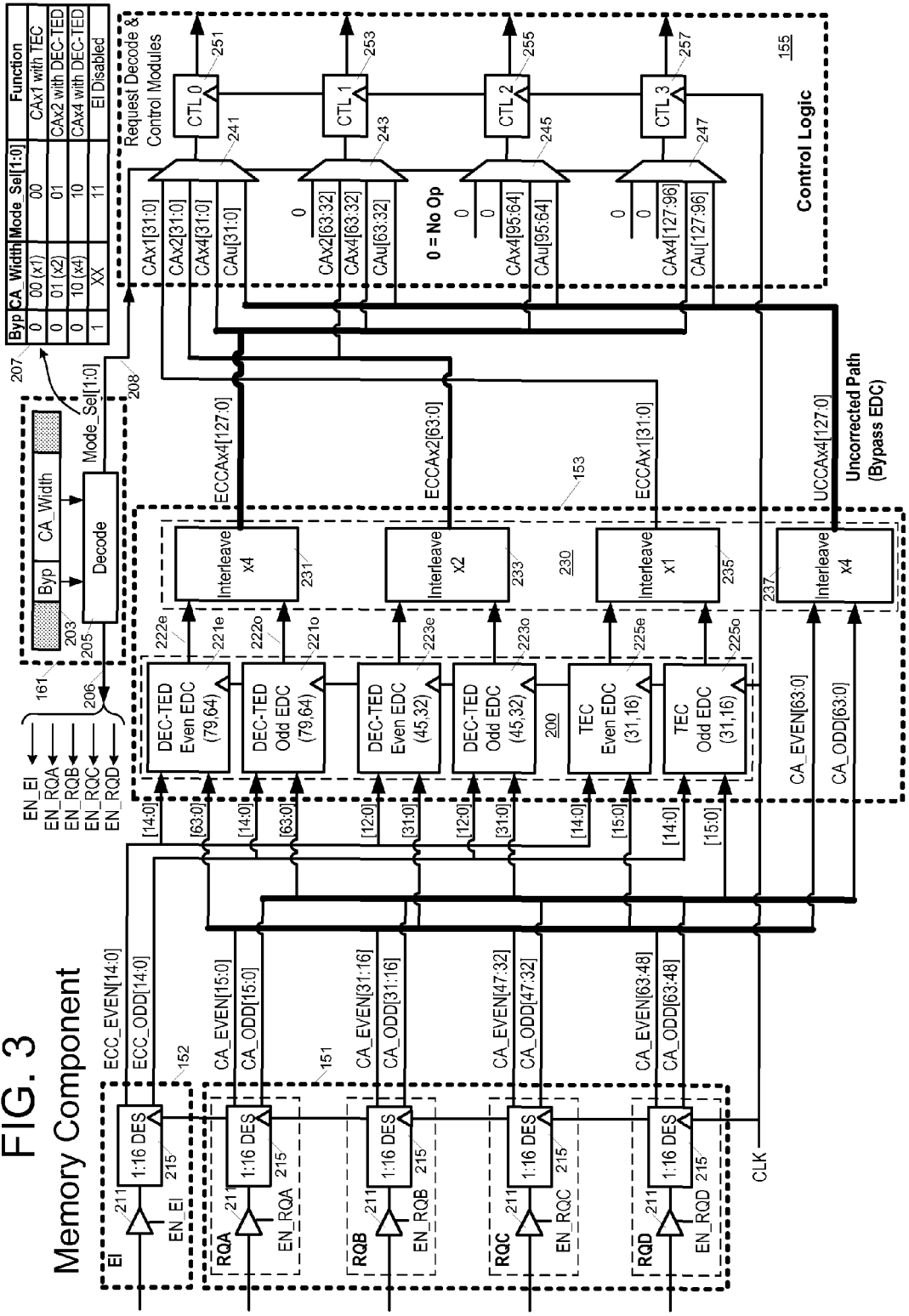
FIG. 3 illustrates more detailed embodiments of the command/address interface, error interface, error detection/correction logic, and control logic and configuration circuit of the memory component depicted in FIG. 1.

FIG. 3 illustrates more detailed embodiments of the CA interface 151, EI interface 152, error logic 153, and control logic 155 and configuration circuit 161 of the memory component depicted in FIG. 1. In the embodiment shown, configuration circuit 161 includes a configuration register 203 having bypass and CA-width fields ("Byp" and "CA_Width"), and decode logic 205 that generates a 2-bit mode-select signal ("Mode_Sel[1:0]") and a set of receiver-enable signals (EN_EI, and EN_RQA-EN_RQD) in accordance with the control values programmed within the bypass and CA-width fields. More specifically, when the bypass value (a single bit in this example) is a '1', error detection/correction circuitry within error logic 153 is bypassed, with CA values received via one or more of the CA link receivers (RQA-RQD) within CA interface 151 being delivered without error detection or correction to request decode and control modules 251, 253, 255, 257 within the control logic 155. By contrast, when the bypass value is a '0', EDC logic 153 operates on command/address values received via CA interface 151, detecting and correcting errors therein using one of multiple different detect/correct circuit blocks in accordance with the width of the CA interface specified in the CA-width field. In the particular embodiment shown, three different CA interface width configurations are supported and are referred to herein as the "x1," "x2," and "x4" CA interface widths according to the number of CA signaling links used to convey CA information to the memory component in each configuration.

In the unbypassed, x4 CA interface configuration (i.e., Byp=0 and CA_Width='10' within configuration register 203), decode circuit 205 asserts all four CA receiver-enable signals (EN_RQA-EN_RQD) and the EI receiver-enable signal (EN_EI), thereby setting CA interface to its maximum logical width (i.e., logical width equal to physical width) and enabling reception of error information. Each deserializing receiver, RQA-RQD and EDC, includes a serial signal receiver 211 that samples an incoming serial bit stream from a respective CA or EI signaling link in response to rising and falling edges (i.e., "even" and "odd" edges) of a high-speed clock signal (not specifically shown) and outputs a corresponding logic-level bit stream to a respective 1:16 deserializing circuit 215. The deserializing circuit 215 converts each incoming sequence of 32 serial bits into a pair of 16-bit input words (i.e., an even input word formed by bits captured at 16 successive rising edges of the high-speed clock, and an odd input word formed by bits captured at 16 successive falling edges of the high-speed clock), with the input words being latched in response to a lower-speed logic clock ("CLK"). Thus, at peak CA bandwidth, CA interface 151 is capable of delivering four pairs of 16-bit CA input words (CA_EVEN [15:0]/CA_ODD[15:0], CA_EVEN[31:16]/CA_ODD[31:16], CA_EVEN[47:32]/CA_ODD[47:32] and CA_EVEN [63:48]/CA_ODD[63:48]) to EDC logic 153 per cycle of the logic clock (and over 16 cycles of the high-speed clock). The EI receiver is similarly capable of delivering a pair of 16-bit EI input words, but, because at most 15 bits of each input word constitute bits within an error correction code (ECC) in the exemplary embodiment shown, the EI receiver output is designated "ECC_EVEN[14:0]" and "ECC_ODD[14:0]."

Continuing with the x4, unbypassed configuration, the reception of at least 15 EDC bits per 64 CA bits provides sufficient check-bit redundancy (e.g., using for example and without limitation Hamming codes, BCH (Bose, Ray-Chaudhuri, Hocquenghem) codes, Reed-Solomon codes, Turbo codes, Low-Density Parity Check (LDPC) codes or any number of other error-check coding schemes) to enable detection of as many as three bit errors ("triple error detect," or "TED") and to enable correction of as many as two bit errors (i.e., "double error correction" or "DEC"). Herein, EDC circuits are described using the nomenclature "(n, k)," where "k" represents the total number of bits supplied to the EDC circuit, and "n" represents the number of "message bits" and the difference between n and k (n minus k) represents the number of error-checking bits (also referred to herein as "redundancy bits," parity bits, ECC bits, EDC bits, syndrome bits, error information bits, etc.) Accordingly, in the embodiment of FIG. 3, the four 16-bit even CA input words are supplied, together with 15 even ECC bits, to a double-error-correct/triple-error-detect (DEC-TED) error detection/correction circuit 221e within error logic 153. EDC circuit 221e, depicted as a "(79,64)" DEC-TED EDC circuit in FIG. 3, performs the error detection/correction function, latching a "corrected" 64-bit even CA output value 222e in response to each rising edge of the logic clock (note that more than one cycle of the logic clock may be allocated for the EDC operation in alternative embodiments), together with one or more optional error-detect signals (not specifically shown). The four 16-bit odd CA input words are similarly supplied, together with the 15 odd ECC bits, to (79,64) DEC-TED EDC circuit 221o, which operates concurrently with circuit 221e, to latch a corrected 64-bit odd CA output value 222o at each rising edge of the logic clock, together with one or more optional error-detect signals.

Figures 5A, 5B, 5C:
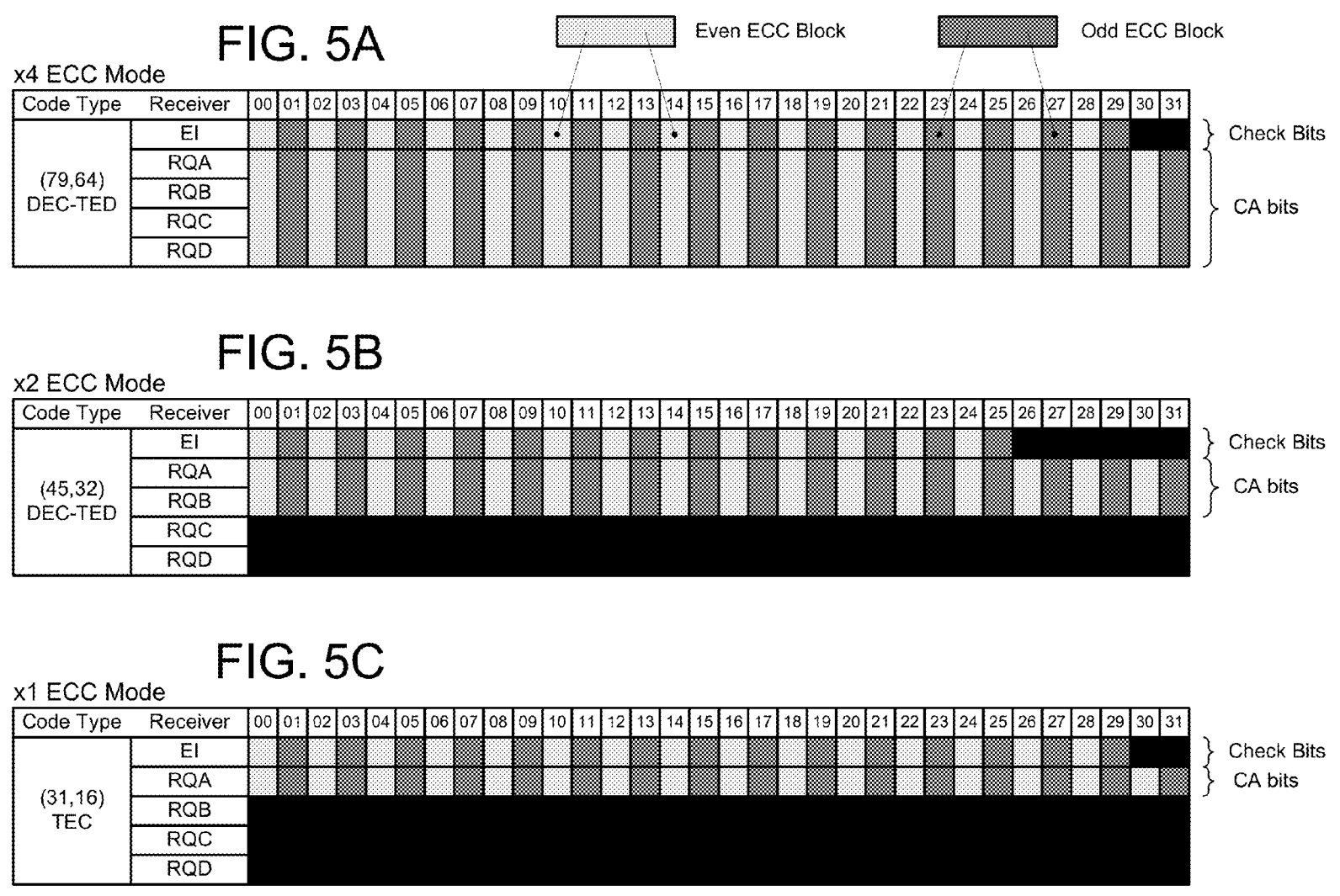

FIG. 5A illustrates the arrangement of CA bits and error-checking bits (i.e., EDC information) within the incoming CA and error information bit streams over 32 successive bit intervals (e.g., 16 cycles of the high-speed clock in an embodiment that employs falling and rising edge clocking, or rising edge clocking using two complementary clocks) in the x4 CA width, unbypassed operating mode. The lightly shaded check bits and CA bits received during even numbered bit intervals are referred to collectively as an even ECC block and correspond to the CA bits and error information bits (or error checking bits or EI bits) operated upon by EDC circuit 221e during a given cycle of the logic clock. By contrast, the more darkly shaded check bits and CA bits received during the odd numbered bit intervals, referred to collectively herein as an "odd ECC block," correspond to the CA and error information bits operated upon by EDC circuit 221o during that same logic clock cycle. As FIG. 5A shows, the two ECC logic blocks are effectively interleaved due to the separation of their respective inputs within the deserializing circuits 215 of the CA interface 151 and EI interface 152. While this "bit-interleaving" is not required (the two ECC blocks could alternatively be formed from CA/EI bits received in respective bursts of 16 bit intervals), bit-interleaving may be advantageous in systems that exhibit bursty bit errors. For example, when bit-interleaved as shown in FIG. 5A, a burst of four bit errors (i.e., bit errors in four successive bit intervals) will yield only two bit errors in each ECC block, and thus a number of bit errors below the bit-correction limit for each of the even and odd EDC circuits 221e, 221o. By contrast, if the same 4-bit error burst occurred within a single ECC block (i.e., where the ECC blocks are formed from information received in successive groups of bit intervals, rather than individually interleaved bit intervals), the number of bit errors would exceed the error detection and error correction capabilities of the DEC-TED EDC circuits provided.

Still referring to FIG. 5A, it should be noted that the interleaved even and odd ECC blocks do not necessarily correspond to the organization of commands and addresses within those blocks. For example, the 32 bits received via RQA may form a single command/address value, despite the fact that the constituent bits of the command/address value are split between even and odd ECC blocks (and thus routed to separate even and odd EDC circuits 221e, 221o). Accordingly, after undergoing error detection/correction within EDC circuits 221e and 221o, the resulting corrected 64-bit ECC values 222e, 222o are restored to their original, interleaved arrangement within x4 interleave circuit 231 (i.e., within interleave logic 230 of FIG. 3), before being supplied as a set of four 32-bit values, ECCAx4[127:0] to control logic 155. Note that, because the even and odd EDC circuits output respective corrected 64-bit CA values in parallel (i.e., 222e, 222o), the interleaving of the constituent bits of those two 64-bit values may be effected without active circuitry and instead by the manner of interconnection between the outputs of EDC circuits 221e, 221o and the inputs to control logic 155. In such an embodiment, interleave circuit 231 (and the other interleave circuits shown within interleave logic 230) may be viewed as a pass-through element in which the outputs of EDC circuits 221e, 221o are overlapped to achieve the desired bit ordering at the input to control logic 155.

Referring again to configuration circuit 161 and more specifically to mode table 207, the unbypassed, x4 CA width configuration yields a mode-select signal "10' that selects, within front-end multiplexers 241, 243, 245 and 247 of control logic 155, the output of interleave circuit 231 (i.e., CAx4 with DEC-TED) to be passed in respective 32-bit portions to request and decode modules 251, 253, 255 and 257. The request and decode modules, in response, output respective sets of address and control signals to the memory core.

Still referring to FIG. 3, in the unbypassed, x2 CA width configuration, CA receivers RQC and RQD are disabled (i.e., by deassertion of signals EN_RQC and EN_RQD), thus narrowing the CA interface to a two-port logical width and therefore to half the four-port physical width. In an embodiment in which the CA signaling rate remains constant across changes in the CA interface width, this halving of the CA interface width results in a halving of the CA bandwidth, and thus reception of 64 CA bits during each logic clock cycle (i.e., each sequence of 32 bit intervals) instead of 128 CA bits. Because the EDC function is engaged (i.e., not bypassed), the deserializing receiver within EI interface 152 continues to receive as many as 32 error checking bits per logic cycle, thereby doubling the EI to CA bit ratio relative to the unbypassed, x4 mode. In the particular implementation shown, the increased EI bit density (i.e., increased ratio of EI bits to CA bits) is sufficient to enable double error correction and triple error detection on even and odd blocks of 32 CA bits. More specifically, the even pair of 16-bit CA words output by CA receivers RQA and RQB are supplied to DEC-TED Even EDC (45,32) circuit 223e together with thirteen even ECC bits (e.g., ECC_EVEN[12:0]), and the odd pair of 16-bit CA words are supplied to DEC-TED Odd EDC (45,32) circuit 223o together with thirteen odd ECC bits (e.g., ECC_ODD [12:0]) to effect the x2 ECC mode shown in FIG. 5B. The two EDC logic circuits 223e, 223o output respective 32-bit corrected CA values to x2 interleave circuit 233 which, in turn, restores the original interleaving of even and odd bits in the 64-bit CA value ECCAx 2[63:0] supplied in respective 32-bit halves to multiplexers 241 and 243. As shown in mode table 207, the unbypassed, x2 CA width configuration yields a mode-select signal '01' that selects, within multiplexers 241 and 243, the output of interleave circuit 233 (i.e., CAx2 with DEC-TED) to be passed to request/decode modules 251 and 253. The remaining request/decode modules (255 and 257) may be disabled.

In the unbypassed, x1 CA width configuration, CA receivers RQB, RQC and RQD are disabled (i.e., by deassertion of signals EN_RQB, EN_RQC and EN_RQD), thus narrowing the CA interface to a single-port logical width, one-quarter of the four-port physical width. In an embodiment in which the CA signaling rate remains constant across changes in the CA interface width, this quartering of the CA interface width results in a quartering of the CA bandwidth, and thus reception of 32 CA bits during each logic clock cycle (i.e., each sequence of 32 bit intervals) instead of 128 CA bits. Because the EDC function is engaged (i.e., not bypassed), as many as 32 error checking bits per logic clock cycle continue to be received via EI interface 152, thus quadrupling the EI-to-CA bit ratio relative to the unbypassed, x4 mode. In the particular implementation shown, the increased EI bit density (i.e., increased ratio of EI bits to CA bits) enables triple error detection and triple error correction (TEC) on even and odd CA words. More specifically, the even 16-bit CA word output by CA receiver RQA (CA_EVEN[15:0]) is supplied to TEC Even EDC (31,16) circuit 225e together with fifteen even ECC bits (e.g., ECC_EVEN[14:0]), and the odd pair 16-bit CA word from CA receiver RQA (CA_ODD[15:0]) is supplied to TEC Odd EDC (31,16) circuit 225o together with fifteen odd ECC bits (i.e., ECC_ODD[15:0]) to effect the x1 ECC mode shown in FIG. 5C. The two EDC circuits 225e and 225o output respective 16-bit corrected CA values to x1 interleave circuit 235 which, in turn, restores the original interleaving of even and odd bits in the 32-bit CA value ECCAx1 [31:0] supplied to multiplexer 241. As shown in mode table 207, the unbypassed, x1 CA width configuration yields a mode-select signal '00' that selects, within multiplexer 241, the output of interleave circuit 234 (i.e., CAx1 with TEC) to be passed to request/decode module 251. The remaining request/decode modules (253, 255 and 257) may be disabled.

Still referring to FIG. 3, if the bypass bit is set within configuration register 203, the EI receiver is disabled (i.e., EN_EI deasserted) and the RQA-RQD receivers are enabled according to the CA interface width setting. For simplicity, only the x4 bypass path is shown, with the outputs of all four deserializing receivers (RQA-RQD) being interleaved within interleave circuit 237 to yield a 128-bit uncorrected command/address value (UCCAx4[127:0] which is delivered in four 32-bit values to multiplexers 241, 243, 245, 247, respectively. As shown in mode table 207, the bypassed configuration yields a mode select signal '11' that selects, within multiplexers 241-247, the four 32-bit uncorrected command/address values (CAu[31:0], CAu[63:32], CAu[95:64] and CAu[127:96]) to be passed to request/decode modules 251-257. In the embodiment shown, bypassing the error detection/correction logic 200 reduces memory access latency by a clock cycle (i.e., consumption of a clock cycle in the EDC stage of the command pipeline is avoided). In alternative embodiments, an additional register, clocked by the logic clock, may be placed in the uncorrected CA path to equalize (or levelize) the CA latency across all CA pipeline configurations.

Reflecting on the memory component operation described in reference to FIG. 3, it can be seen that the command/address error correction capability of the memory component, and thus the CA error-tolerance of the memory system as a whole increases as the width of the memory component CA interface is narrowed. Accordingly, as shown in FIG. 2, the command/address error detection capability and error correction capability increase as command/address bandwidth of the controller component is dispersed among an increasing number of attached memory components. Though x1, x2 and x4 interface widths are shown, intermediate interface widths (e.g., x3) may also be supported, and a physically wider CA interface may be varied between a larger number of logical width configurations.

Figure 4A:
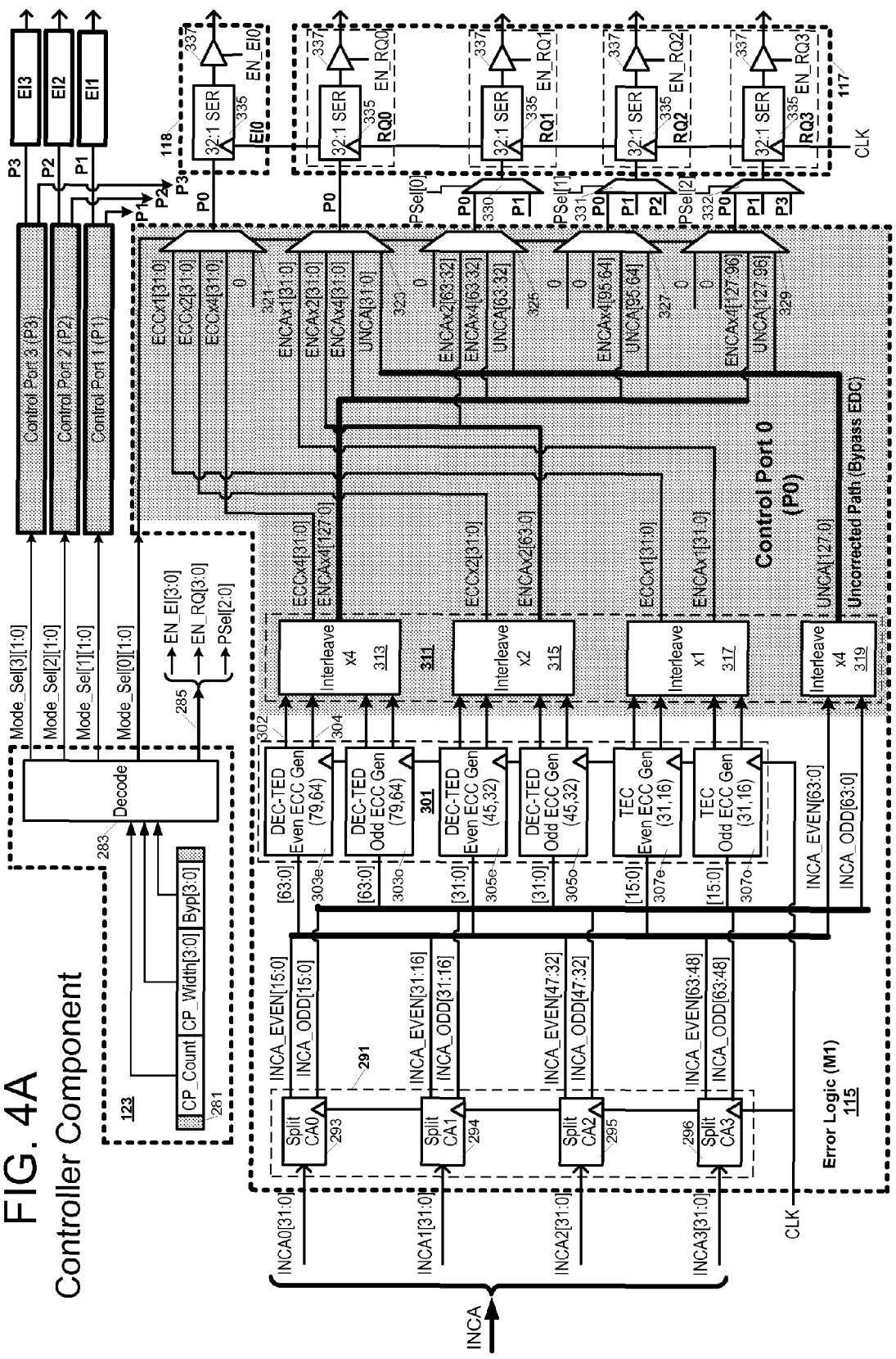
FIG. 4A illustrates more detailed embodiments of the command/address interface, error interface, error detection/correction logic, and configuration circuit of the controller component shown in FIG. 1.

FIG. 4A illustrates more detailed embodiments of the CA interface 117, EI interface 118, error logic 115, and configuration circuit 123 of the controller component shown in FIG. 1. The configuration circuit 123 includes a configuration register 281 having fields to store (i) a control-port count value ("CP_Count") that indicates the number of activated (enabled) control ports within the controller component, (ii) control port width values (CP_Width[3:01]) that indicate respective CA interface widths for the activated control ports, and (iii) bypass values (Byp[3:0] that indicate, for each activated control port, whether the error detection/correction function is to be bypassed. In the embodiment shown, each control port (P0, P1, P2 and P3) serves as a logical port for routing CA information and EI information to a respective attached memory component. Thus, if only a single memory component is attached to the controller component, the control-port count field is set to 1, thereby activating control port P0 (and disabling control ports P1-P3) and enabling allocation of the full CA bandwidth of the controller component to a single memory component. By contrast, if two or more memory components are to be controlled by the controller component, the control-port field is set to 2, 3 or 4, thereby activating various combinations of control ports and splitting allocation of the CA bandwidth of the controller component among the two or more attached memory components.

As shown, configuration circuit 123 includes a decoder 283 coupled to receive the control-port count value, control-port width values and bypass values from the corresponding fields of configuration register 281 and to generate a number of 2-bit mode-select signals to be output to respective control ports (i.e., Mode_Sel[3:0][1:0], as there are four control ports in this example), a set of receiver-enable signals (EN_EI, and EN-RQ0-EN_RQ3), and a set of port-select signals PSel[2:0] in accordance with the control values programmed within configuration register 281.

The port-select signals are supplied to port multiplexers 330, 331 and 332 to pass the outputs of selected control ports to output drivers RQ0-3, and thus allocate portions of the controller component CA interface to the respective control ports. FIG. 4B illustrates an exemplary control port assignment for various control-port count values and control-port width values that may be applied within the embodiment of FIG. 4A. As shown, the control-port count value (CP Count) may be set to 1, 2, 3 or 4 (referred to herein as single, dual, triple and quad control port configurations, respectively), and the width of each control port (CP Width) set in accordance with the control port count. Thus, in the single control port configuration, the active control port, P0, may be set to widths of 1, 2 or 4, while the inactive control-port widths are set to zero; in the dual control-port configuration, the active control ports P0 and P1 may each be set to widths of 1 or 2, and so forth as shown.

Still referring to the exemplary configuration options shown in FIG. 4B, when in a single-port, x1-width configuration, output drivers RQ1-RQ3 are unused (disabled) and the port-selections within port multiplexers are shown as 'xx' (don't care). In the single-port, x2 width configuration, RQ1 is allocated to control port 0 (RQ2 and RQ3 remaining disabled), and in the single-port, x4 width configuration, all four output drivers are allocated to control port 0. In the dual-port configuration (i.e., P0 and P1 active), output drivers RQ1-RQ3 are allocated to control ports 0 and 1 according to the width configurations for those ports as shown. Similarly, in the triple-port configuration (i.e., P0, P1 and P2 active), output drivers RQ1-RQ3 are allocated to the active control ports according to their width configurations as shown. In the quad port configuration, an output driver is allocated to each of the active control ports and thus the port multiplexers select control ports 1, 2 and 3 to source CA information to output drivers RQ1, RQ2 and RQ3, respectively.

Returning to FIG. 4A when the bypass value corresponding to a given control port is a '1', ECC generator bank 301 within error logic 115 is bypassed, and the incoming CA values (INCA) are delivered to without correction to serializing output drivers RQ0-RQ3 within the CA interface 117. By contrast, when the bypass value is a '0', error logic 115 operates on incoming command/address values (INCA) received via the host I/O logic (not shown in FIG. 4A), generating error correction codes (ECCs) for respective blocks of command/address values using one of multiple different detect/correct circuit ECC generators in accordance with the number of control ports specified by the CP_Count value and the CA interface width to be allocated to the control port or control ports as indicated by the CP_Width values. In the particular embodiment shown, three different CA interface width configurations are supported and are referred to herein as the "x1," "x2," and "x4" interface widths according to the number of CA signaling links used to convey CA information to an attached memory component. Additional and/or different CA interface width configurations may be supported in alternative embodiments.

In the unbypassed, x4 interface configuration within a given control port 'i' (i.e., Byp[i]=0 and CP_Width[i]=4 within configuration register 281), even/odd splitter circuits 293, 294, 295 and 296 within buffer logic 291 convert respective incoming 32-bit CA values (INCA0[31:0]-INCA3[31:0]) into four respective sets of 16-bit even and odd input words (i.e., an even input CA word formed by bits 0, 2, 4, . . . , 30 within the incoming 32-bit CA value, and an odd input CA word formed by bits 1, 3, 5, . . . , 31) in response to each rising edge of logic clock signal, CLK. The four 16-bit even CA input words are supplied to error correction code (ECC) generator 303e (i.e., within ECC generator bank 301) which includes logic circuitry to generate a sufficient number of error-check bits (15 in this example) to enable double-error correction and triple-error detection (DEC, TED) when provided, together with the original 64 CA bits, to counterpart EDC circuit 221e of FIG. 3. ECC generator 303e is thus shown as a DEC-TED (79,64) ECC generator in FIG. 4A and outputs a 15-bit ECC value 302 together with the original 64 even CA bits 304 to x4 interleave circuit 313 as frequently as once per clock cycle (i.e., at peak command throughput of the controller component). The four 16-bit odd input CA words are similarly supplied to ECC generator 303o (79,64, DEC-TED ECC generator) which, in turn, outputs a 15-bit ECC value and the original 64 odd input CA bits to x4 interleave circuit 313.

Referring to the detail view of control port 0 (P0), interleave circuit 313 recombines the originally split even and odd data words (recreating the input to splitter circuits 293) to produce a x4-mode encoded data value, ENCAx4[127:0], and similarly combines the even and odd ECC values to produce a consolidated x4-mode ECC word, ECCx4[31:0] (two bits of which are populated with don't-care information and thus may arbitrarily be set to '0' or '1'). As shown in mode table of FIG. 4C, the unbypassed single-port (CP Count=1), x4 width (CP_Width[0]=4) configuration yields a mode-select signal for control port 0 (Mode_Sel[0][1:0]) that selects, within multiplexers 323, 325, 327 and 329, the output of interleave circuit 313 (i.e., CAx4 with DEC-TED) to be passed to the four 32:1 serializing transmitters of the CA interface 117 (i.e., each serializing transmitter including a 32:1 serializer 335 and an output driver 337) and that selects, within ECC multiplexer 321, the x4-mode ECC word, ECCx 4[31:0], to be passed to a 32:1 serializing transmitter that forms error information interface 118 (EI0). The serialization operations within the CA interface and EI0 interface collectively yield respective bit streams corresponding to the x4 ECC mode shown in FIG. 5A.

Still referring to the single-port mode shown in FIG. 4C (i.e., CP_Count=1), in the unbypassed x2 width configuration (i.e., CP_Width=2 within configuration register 281), splitter circuits 293 and 294 convert respective incoming 32-bit CA values (INCA0[31:0] and INCA1[31:0]) into respective sets of 16-bit even and odd input words in response to each rising edge of controller clock signal, CLK. The two 16-bit even CA input words are supplied to ECC generator 305e which includes logic to generate a sufficient number of error-check bits (13 in this case) to enable double-error correction and triple-error detection when provided, together with the original 32 CA bits, to counterpart EDC circuit 223e of FIG. 3. ECC generator 305e is thus shown as a DEC-TED (45,32) ECC generator in FIG. 4A and provides a 13-bit ECC output value together with the original 32 even CA bits to x2 interleave circuit 315 as frequently as once per clock cycle. The two 16-bit odd input CA words are similarly supplied to ECC generator 305o (45,32, DEC-TED ECC generator) which, in turn, outputs a 13-bit ECC value and the original 32 odd CA bits to interleave circuit 315.

Referring to the detail view of control port 0 shown in FIG. 4A, interleave circuit 315 recombines the originally split even and odd data words to produce a x2-mode encoded CA value, ENCAx2[63:0], and similarly combines the even and odd ECC values to produce a consolidated x2-mode ECC word, ECCx2[31:0] (six bits of which are populated with don't-care information and thus may arbitrarily be set to '0' or '1'). As shown in FIG. 4C, the unbypassed, single-port x2 interface width configuration yields a mode-select signal '01' that selects, within multiplexers 323 and 325, the output of interleave circuit 315 (i.e., CAx2 with DEC-TED) to be passed to a pair of 32:1 serializing transmitters and that selects, within ECC multiplexer 321, the x2-mode ECC word, ECCx 2[31:0], to be passed to the 32:1 serializing transmitter included within EI interface 118. Decode circuit 283 responds to the x2 width configuration (and logic '0' state of the bypass bit) by deasserting EN_RQ2 and EN_RQ3 (thus disabling output drivers RQ2 and RQ3) and enabling the remaining output drivers. The serialization operations within the enabled output drivers of the x2 CA interface (i.e., RQ0 and RQ1) and the EI interface collectively yield respective bit streams corresponding to the x2 ECC mode shown in FIG. 5B.

In the unbypassed, single-port, x1 interface configuration (i.e., CP_Count=1, CP_Width[0]=1 and Byp[0]=0, within configuration register 281), splitter circuit 293 converts incoming 32-bit CA value INCA0[31:0] into even and odd input words (INCA_EVEN[15:0] and INCA_ODD[15:0]) in response to each rising edge of controller clock signal, CLK. The even CA input word is supplied to ECC generator 307*e* which generates a sufficient number of error-check bits (15 in this example) to enable triple error detection and triple error correction when provided, together with the original 16 even CA bits, to the counterpart EDC circuit 225*e* shown in FIG. 3. ECC generator 307*e* is thus shown as a TEC (31,16) ECC generator in FIG. 4A and provides a 15-bit ECC output value together with the original 16 even CA bits to x1 interleave circuit 317 within control port 0 as frequently as once per clock cycle. The 16-bit odd input CA word is similarly supplied to ECC generator 307*o* (31,16 TEC ECC generator) which, in turn, outputs a 15-bit ECC value and the original 16 odd CA bits to interleave circuit 317.

Within control port 0, interleave circuit 317 recombines the originally split even and odd data words to produce a x1-mode encoded CA value, ENCAx1[31:0], and similarly combines the even and odd ECC values to produce a consolidated x1-mode ECC word, ECCx1[31:0] (two bits of which are populated with don't-care information and thus may arbitrarily be set to '0' or '1'). As shown in mode table 288, the unbypassed, single-port, x1 CA width configuration yields a mode-select signal (i.e., Mode_Sel[0][1:0]) that selects, within multiplexer 323 the output of interleave circuit 317 (i.e., CAx1 with TEC) to be passed to serializing transmitter RQ0 and that selects, within ECC multiplexer 321, the x1-mode ECC word, ECCx1[31:0], to be passed to the serializing transmitter within EI interface 118. Decode circuit 283 responds to the single-port, x1 width configuration (and logic '0' state of the bypass bit) by deasserting EN_RQ1, EN_RQ2 and EN_RQ3 (thus disabling output drivers RQ1, RQ2 and RQ3) and enabling the remaining output drivers. The serialization operations within the enabled output drivers of the x1 CA interface (i.e., RQ0) and the EDC interface collectively yield bit streams corresponding to the x1 ECC mode shown in FIG. 5C.

In single port mode, control ports 1-3 are unused as shown in FIG. 4C, so that corresponding error information interfaces EI1-EI3 are also unused and disabled to save power. When a given control port is unused, logic therein may be disabled (e.g., left in an unclocked state) to limit power consumption.

The overall interface bandwidth of the controller component may also be allocated entirely or fractionally to the single active control port in single port mode. By contrast, when two or more control ports are active (i.e., CP_Count>1), the overall CA interface width (and thus the CA bandwidth of the controller component) is split between the active control ports. Thus, in the dual control port configuration shown in FIG. 4C, control ports 0 and 1 may each be operated in a x1 width configuration (enabling triple-error-correcting ECC generation within each control port and leaving half the controller component CA output drivers, RQ2 and RQ3, unused and disabled), in a x2 width configuration (enabling double-error-correcting/triple-error-detecting ECC generation within each control port and consuming the entire CA interface) or a combination of the two (one device in x1 width and the other in x2 width). In a triple control port configuration, control ports 0-2 may each be operated in a x1 width configuration (enabling triple-error-correcting ECC generation within each control port and leaving one of the controller component CA output drivers, RQ3, unused and disabled), or with one of the control ports in a x2 width configuration and the others in a x1 width configuration. Lastly, in a quad control port configuration, all four control ports are active and operated in a x1 width configuration, thereby enabling triple-error-correcting ECC generation within each control port as shown.

Reflecting on FIGS. 4A-4C, it can be seen that not all control ports need be operable in the same width configuration, and thus that interleave logic and multiplexer circuitry provided to support the full range of width configurations may be omitted in one or more of the control ports. In an embodiment limited to the configurations shown in FIG. 4C, for example, control ports 3 and 4 are operable only in the x1 width configuration and thus interleave circuits 313 and 315, and multiplexers 325, 327 and 329 may be omitted from that control port. Similarly, control port 2 is operable only in the x1 and x2 width configurations so that interleave circuit 313 and multiplexers 327 and 329 may be omitted. In other embodiments, each of the control ports may be activated regardless of the activation state of other control ports (e.g., control port 4 activated, but not control port 0), so that numerous configurations other than those shown in FIG. 4C may be supported and each control port populated, for example, by the interleave and multiplexing logic circuitry shown.

Still referring to FIGS. 4A and 4B, if the bypass bit for a given control port is set within configuration register 281 (i.e., Byp[i]=1), the EI interface for that control port is disabled (i.e., EN_EI deasserted) and one or more of output drivers RQA-RQD are enabled and allocated to the control port according to the control port count and the interface widths for the active control ports. For simplicity, FIG. 4A illustrates the signaling paths within control port 0 for the bypassed, single-port, x4-width configuration only, with the outputs of all four serializing output drivers (RQ0-RQ3) being enabled to output respective 32-bit uncorrectable CA values (UNCA) from control port 0 during each cycle of the controller clock. In other configurations, uncorrectable CA values or a combination of correctable and uncorrectable CA values may be received from two or more control ports.

Bypassing the ECC generator bank 301 potentially reduces memory access latency as removal of that stage in the command pipeline saves at least a clock cycle. Note that, because the interleaving operation in interleave circuit 319 effectively reverses the even/odd splitting effected within splitting circuits 293-296, the incoming CA values may alternatively be routed directly from the CA input source to respective UNCA inputs of multiplexers 321 and 323, bypassing splitter circuits 293-296 (and interleave circuit 319) and thus potentially reducing memory access latency further relative to the error corrected paths.

Figure 6:
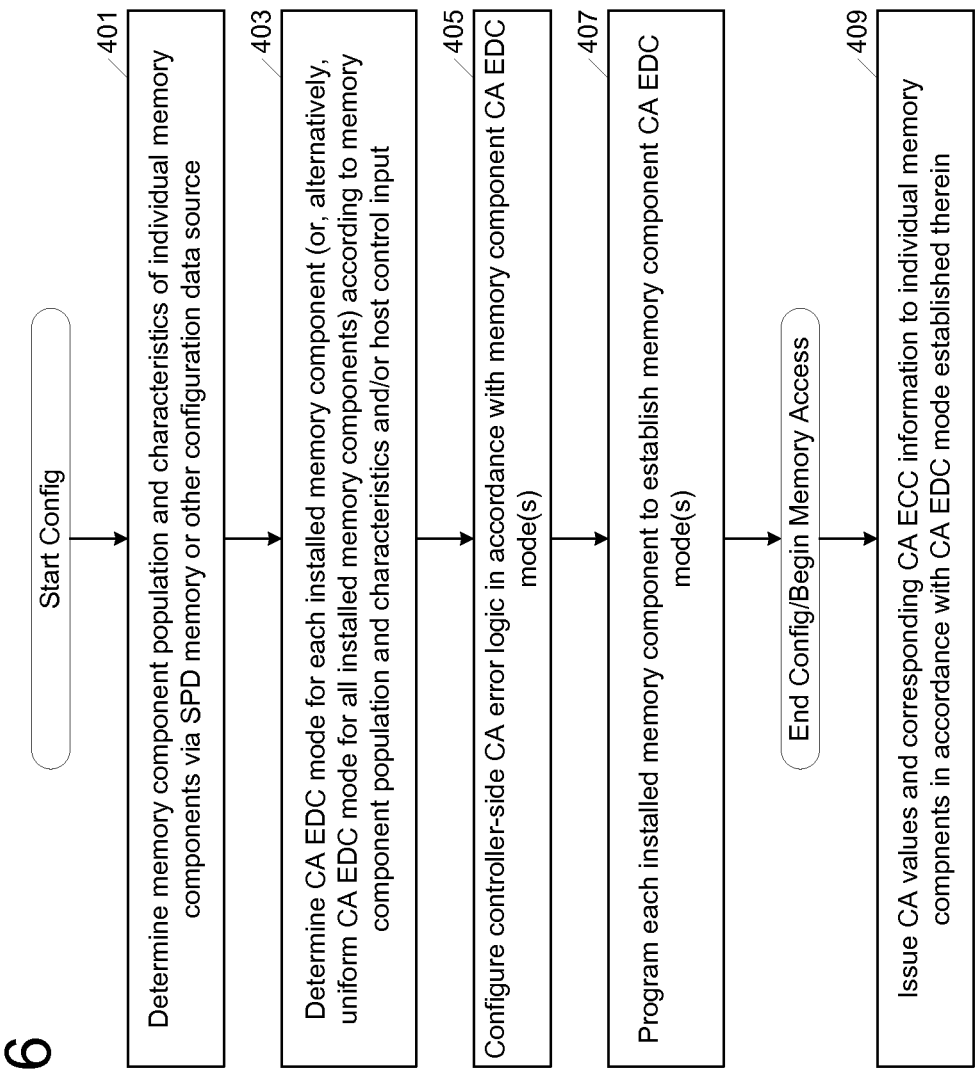
FIG. 6 illustrates a sequence of configuration operations that may be executed by a controller component (and/or another component that controls the controller component) to configure the command/address error detection/correction operation within the memory system of FIG. 1.

FIG. 6 illustrates a sequence of configuration operations that may be executed by controller component 101 of FIG. 1 (and/or another component that controls the controller component) to configure the CA error detection/correction operation of memory system 100. Starting at 401, the controller component determines the memory component population (i.e., number of attached memory components) and characteristics of individual memory components by reading such information from a non-volatile configuration memory (e.g., a relatively small memory co-located with one or memory components within an IC package, on a memory module, or on a printed circuit board, such as a serial presence detect memory, or the like), from non-volatile storage within the memory component(s) themselves, or from any other configuration data source. At 403, the controller component determines a CA error detection/correction (CA EDC) mode for each installed memory component according to the memory component population and characteristics of individual memory components (e.g., whether a given component supports CA EDC operation and, if so, the specific CA EDC options supported). At 405, the controller component configures the control-side CA error logic in accordance with the CA EDC mode or modes determined at 403, and at 407 the controller component programs each installed memory component to establish the memory component EDC modes determined at 403. As explained above, memory component programming may be effected, for example, by issuing register-write commands (together with mode values to be programmed) to respective memory components via one or more of the CA signaling links (i.e., links 102 in FIG. 1), thereby concluding the CA EDC mode configuration within the memory system. As an example of this operation, if the controller component determines (e.g., by reading an SPD or other configuration information source) that the population of attached memory components consists of a uniform set of memory components having respective architectures as shown in FIG. 3, the controller component may program its internal configuration register (e.g., element 281) and that of each installed memory component according to the memory component population size. That is, if a single memory component is coupled to the controller component, the controller component may configure itself and the memory component for x1 CA EDC operation, maximizing the ratio of transmitted CA error checking bits to CA bits and thus enabling triple error correction within the memory component. If two memory components are present, the controller component may configure the memory components and itself for x2 CA EDC operation (e.g., DEC-TED on respective blocks of 32 CA bits), and if four memory components are present, the controller component may configure the memory components and itself for x4 CA EDC operation (e.g., DEC-TED on respective blocks of 64 CA bits). The controller component may also disable CA EDC operation permanently or temporarily when instructed to choose the lower latency bypassed CA path instead. In any case, at 409, after CA EDC modes have been established within the various components of the memory system, the controller component issues CA values and corresponding ECC information which may include parity bits, checksum bits, cyclic-redundancy-check (CRC) values or any combination thereof) to individual memory components or to groups of memory components in accordance with the CA EDC mode(s) established therein.

While the memory system of FIG. 1 and the memory component and controller components of FIGS. 3 and 4 have been described in terms of register-configured CA EDC operation, the CA EDC operation to be formed with respect to a given command may alternatively (or additionally) controlled by information provided within the command itself. For example, information indicating whether to perform CA error detection/correction with respect to a given CA value and/or the nature of the EDC operation to be performed may be pre-pended or appended to the command/address transmission (or embedded in the command itself, for example, within otherwise unused bit fields) or to/within a previous command/address transmission (i.e., each command indicating whether CA EDC is to be carried out with respect to the command that follows). CA EDC information embedded within or appended/pre-pended to a command may include index bits to look-up the CA EDC operation to be performed within a hardwired or programmed lookup table, or may include operation control bits corresponding, for example, to the bypass and CA interface width bits otherwise programmed within the memory-component configuration register 203 shown in FIG. 3.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Additionally, links or other interconnection between integrated circuit devices or internal circuit elements or blocks may be shown as buses or as single signal lines. Each of the buses may alternatively be a single signal line, and each of the single signal lines may alternatively be buses. Signals and signaling links, however shown or described, may be single-ended or differential. A signal driving circuit is said to "output" a signal to a signal receiving circuit when the signal driving circuit asserts (or deasserts, if explicitly stated or indicated by context) the signal on a signal line coupled between the signal driving and signal receiving circuits. The term "coupled" is used herein to express a direct connection as well as a connection through one or more intervening circuits or structures. Integrated circuit device "programming" may include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement.

While the invention has been described with reference to specific embodiments thereof, it will be evident that various modifications and changes may be made thereto without departing from the broader spirit and scope. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. An integrated-circuit memory component comprising:
    a data storage array;
    a command/address interface to receive command/address information via a variable number of external signaling links in accordance with a command/address interface width indicated by a width configuration value, the command/address information specifying a storage location within the data storage array and a memory access operation to be executed with respect to the storage location;
    an error information interface to receive error-checking information via one or more error information links external to the integrated-circuit memory component; and
    error circuitry to detect errors within the command/address information using the error-checking information according to (i) a first error detection scheme if the width configuration value indicates a first command/address interface width in which the command/address information is to be received via a first number of external signaling links, and (ii) a second error detection scheme if the width configuration value indicates a second command/address interface width in which the command/address information is to be received via a second number of external signaling links, wherein the first and second error detection schemes are different from one another and the first and second numbers of external signaling links are different from one another.

2. The memory component of claim 1 wherein a ratio of error-checking information to command/address information is higher in the first error detection scheme than in the second error detection/scheme.

3. The memory component of claim 1 wherein the first error detection scheme enables detection of a first number of bit errors within the command/address information, and the second error detection scheme enables detection of a second number of bit errors within the command/address information, the second number of bit errors being less than the first number of bit errors.

4. The memory component of claim 1 further comprising a configuration register to store the width configuration value.

5. The memory component of claim 1 wherein the command/address information specifies the width configuration value.

6. The memory component of claim 1 wherein the error circuitry comprises error correction circuitry to correct errors detected within the command/address information according to (i) a first error correction scheme if the width configuration value indicates that the command/address information is to be received via the first number of external signaling links, and (ii) a second error correction scheme if the width configuration value indicates that the command/address information is to be received via the second number of external signaling links.

7. The memory component of claim 1 wherein, in the first error correction scheme, the error correction circuitry is capable of correcting a higher number of bit errors per predetermined number of bits of the command/address information than in the second error correction scheme.

8. A controller component for controlling an integrated-circuit memory component, the controller component comprising:
    a command/address interface to output command/address information to the memory component via a variable number of external signaling links in accordance with a command/address interface width indicated by a width configuration value, the command/address information specifying a storage location within a data storage array of the memory component and a memory access operation to be executed with respect to the storage location;
    an error information interface to output error-checking information to the memory component via one or more error information links; and
    error circuitry to generate the error-checking information based on the command/address information according to (i) a first error detection scheme if the width configuration value indicates a first command/address interface width in which the command/address information is to be output via a first number of external signaling links, and (ii) a second error detection scheme if the width configuration value indicates a second command/address interface width in which the command/address information is to be output via a second number of external signaling links, wherein the first and second error detection schemes are different from one another and the first and second numbers of external signaling links are different from one another.

9. The controller component of claim 8 wherein the ratio of error-checking information to command/address information is higher in the first error detection scheme than in the second error detection/scheme.

10. The controller component of claim 8 wherein the first error detection scheme enables a memory component that receives the command/address information and error-checking information to detect a first number of bit errors within the command/address information, and the second error detection scheme enables the memory component to detect a second number of bit errors within the command/address information, the second number of bit errors being less than the first number of bit errors.

11. The controller component of claim 8 wherein the command/address interface is additionally to output a configuration value to the memory component to indicate to the memory component which of the first and second error detection schemes was used to generate the error-checking information.

12. The controller component of claim 8 further comprising a configuration register to store the width configuration value.

13. The controller component of claim 8 wherein the error-checking information enables correction of errors within the command/address information.

14. A method of operation within an integrated-circuit memory component having a data storage array, the method comprising:
- receiving command/address information via one of a plurality of different numbers of external signaling links in accordance with a command/address interface width indicated by a width configuration value, the command/address information specifying a storage location within the data storage array and a memory access operation to be executed with respect to the storage location;
- receiving error-checking information via one or more error information links external to the integrated-circuit memory component; and
- detecting errors within the command/address information using the error-checking information according to (i) a first error detection scheme if the width configuration value indicates a first command/address interface width in which the command/address information is to be received via a first number of external signaling links, and (ii) a second error detection scheme if the width configuration value indicates a second command/address interface width in which the command/address information is to be received via a second number of external signaling links, wherein the first and second error detection schemes are different from one another and the first and second numbers of external signaling links are different from one another.

15. The method of claim 14 wherein a ratio of error-checking information to command/address information is higher in the first error detection scheme than in the second error detection scheme.

16. The method of claim 14 wherein detecting errors according to the first error detection scheme comprises detecting a first number of bit errors within the command/address information, and detecting errors according to the second error detection scheme comprises detecting a second number of bit errors within the command/address information, the second number of bit errors being less than the first number of bit errors.

17. The method of claim 14 further comprising storing the width configuration value within a configuration register of the memory component.

18. The method of claim 14 wherein receiving the command/address information comprises receiving information that specifies the width configuration value.

19. The method of claim 14 further comprising correcting errors within the command/address information detected according to the first or second error detection schemes.

* * * * *